United States Patent
Lee et al.

(10) Patent No.: US 7,326,858 B2
(45) Date of Patent: Feb. 5, 2008

(54) PRINTED CIRCUIT BOARD WITH EMBEDDED CAPACITORS AND MANUFACTURING METHOD THEREOF

(75) Inventors: Seok-Kyu Lee, Chungcheongbuk-do (KR); Byoung-Youl Min, Seoul (KR); Hyun-Ju Jin, Busan (KR); Jang-Kyu Kang, Daejeon (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 109 days.

(21) Appl. No.: 10/731,246

(22) Filed: Dec. 10, 2003

(65) Prior Publication Data

US 2004/0118602 A1 Jun. 24, 2004

(30) Foreign Application Priority Data

Dec. 24, 2002 (KR) ................. 10-2002-0083607

(51) Int. Cl.
*H05K 1/16* (2006.01)
(52) U.S. Cl. ......................... 174/260; 174/262
(58) Field of Classification Search ............... 174/260, 174/262, 261; 361/760, 763, 766
See application file for complete search history.

(56) References Cited

U.S. PATENT DOCUMENTS

| 5,079,069 A | 1/1992 | Howard et al. |
| 5,155,072 A * | 10/1992 | Bruno et al. ................ 501/138 |
| 5,261,153 A | 11/1993 | Lucas |
| 5,745,334 A * | 4/1998 | Hoffarth et al. ............ 361/313 |
| 5,764,491 A * | 6/1998 | Tran ........................... 361/794 |
| 5,800,575 A | 9/1998 | Lucas |
| 5,843,806 A * | 12/1998 | Tsai ........................... 438/107 |
| 5,912,809 A * | 6/1999 | Steigerwald et al. ........ 361/780 |
| 6,215,649 B1 * | 4/2001 | Appelt et al. ............... 361/312 |
| 6,274,224 B1 | 8/2001 | O'Bryan et al. |
| 6,349,456 B1 | 2/2002 | Dunn et al. |
| 6,693,793 B2 * | 2/2004 | Kuwako et al. ............ 361/323 |
| 2003/0063453 A1 * | 4/2003 | Kusagaya et al. .......... 361/794 |
| 2003/0161959 A1 * | 8/2003 | Kodas et al. ............ 427/376.2 |

FOREIGN PATENT DOCUMENTS

| JP | 410130051 A * | 5/1998 |
| JP | 02001267751 A * | 9/2001 |

* cited by examiner

*Primary Examiner*—Ishwar (I. B.) Patel
(74) *Attorney, Agent, or Firm*—Morgan, Lewis & Bockius LLP

(57) ABSTRACT

Disclosed is a printed circuit board which is advantageous in terms of high capacitance by embedding capacitors comprising polymer capacitor pastes with high-dielectric constant coated on an inner layer of the printed circuit board and then semi-dried to a state of B-stage.

5 Claims, 14 Drawing Sheets

PRINTED CIRCUIT BOARD WITH EMBEDDED CAPACITORS AND MANUFACTURING METHOD THEREOF

BACKGROUND OF THE INVENTION

1. Field of the Invention

The present invention relates to printed circuit boards with embedded capacitors, and manufacturing methods thereof. More specifically, the present invention is directed to a printed circuit board having embedded capacitors which is advantageous in terms of high capacitance, resulting from coating high-dielectric constant of a polymer capacitor paste on an inner layer of the printed circuit board and semi-drying the coated capacitor paste to a state of B-stage, and a method of manufacturing the same.

2. Description of the Prior Art

Although discrete chip resistors or discrete chip capacitors have been generally mounted on a printed circuit board (PCB), in recent years, PCBs having passive components such as resistors or capacitors embedded therein are under development.

Such embedded passive components technology for PCBs is set to embed passive components such as resistors or capacitors into the PCB by means of a new material and fabrication process, and thusly fabricated passive components can function as conventional chip resistors and chip capacitors. The embedded passive component PCB means that the passive components such as capacitors get buried in an outer layer or on an inner layer of the PCB. If capacitors as the passive components are integrally incorporated into the PCB regardless of the size of the board, it is called "embedded capacitor". Such a PCB is referred to as an embedded capacitor PCB. The embedded capacitor PCB is characterized in that the capacitor is inherently placed as a part of the PCB, and thus it needs not be additionally mounted onto a surface of the board.

At present, techniques of fabricating the embedded capacitor PCB are classified into three types as follows.

First, there is provided a process of fabricating a polymer thick film (PTF) type capacitor by coating and thermally curing (drying) a polymer capacitor paste. The polymer capacitor paste is coated and then dried onto the inner layer of the PCB, on which a copper paste is printed and dried to define electrodes, thereby manufacturing the embedded capacitor.

Second, there is provided a process of fabricating an embedded discrete-type capacitor by coating a ceramic-filled photo-dielectric resin on the PCB, by Motorola, Inc., USA. The photo-dielectric resin containing ceramic powders are applied on the board, onto which a copper foil has been laminated to define each top and bottom electrode, after which circuit patterns are formed and the photo-dielectric resin is etched, to prepare the discrete type capacitor.

Third, there is provided a process of fabricating a capacitor by interposing a dielectric layer having capacitance properties into the PCB, capable of being substituted for a decoupling capacitor mounted onto the PCB, by Sanmina Corporation, USA. The dielectric layer comprising a power electrode and a ground electrode is laminated onto the inner layer of the PCB, to function as a power distributed decoupling capacitor.

Many efforts for developing various practicable processes and embodying such processes have been carried out, based on the three techniques mentioned above. However, the embedded capacitor PCB has not yet been actively fabricated. Therefore, standard technology for fabrication of the embedded capacitor PCB has not been established up to now, and a commercially available process technology is still under study.

A detailed description will be given of a printed circuit board having embedded capacitors and a manufacturing method thereof according to conventional techniques, with reference to the attached drawings, below.

In FIGS. 1a through 1e, there is sequentially illustrated a manufacturing process of a printed circuit board having embedded PTF-type capacitors according to a first embodiment of conventional techniques, in which the polymer capacitor paste is coated and dried (or cured) to prepare the PTF-type capacitor.

In detail, as shown in FIG. 1a, a copper foil formed of FR-4 is attached on an inner layer 42 of the PCB, and a dry film is coated on the copper foil, exposed and developed. Thereafter, the copper foil is etched to form copper foils 44a and 44b for positive electrodes, copper foils 43a and 43b for negative electrodes and clearance therebetween.

In FIG. 1b, capacitor pastes 45a and 45b comprising high-dielectric constant of ceramic powder-containing polymer are coated on the copper foils 43a and 43b for the negative electrode by use of a screen printing process, and then dried or cured. Herein, the screen printing process is performed by passing a medium such as an ink through a stencil screen with the use of a squeezing process to transfer patterns onto the surface of the board.

As such, the capacitor pastes 45a and 45b are coated on the copper foils 43a and 43b as well as the clearance between the copper foils 43a and 43b and the copper foils 44a and 44b for the positive electrode.

In FIG. 1c, a conductive paste, such as silver or copper, is formed onto positive electrodes 46a and 46b by means of a screen printing process, and then dried or cured.

In FIG. 1d, the capacitor layers formed on the inner layer 42 of the PCB as mentioned above are interposed between insulation layers 47a and 47b and then laminated. In the drawing, reference numerals 48a and 48b designate copper layers attached onto the insulation layers 47a and 47b.

In FIG. 1e, through-holes (TH) and laser blinded via holes (LBVH) 49a and 49b are formed in the laminated layers, by which the capacitors on the inner layer of the board are connected to positive terminals 51a and 51b and negative terminals 50a and 50b of integrated circuit (IC) chips 52a and 52b mounted on an outer layer of the board, and thus play a part in embedded capacitors.

However, the above manufacturing process according to the first embodiment of conventional techniques suffers from cracking of the capacitor pastes 45a and 45b at end portions of the positive electrodes 46a and 46b.

FIGS. 2a and 2b are views for explaining the problems of the PCBs manufactured by FIGS. 1a through 1e.

When the capacitor pastes 45a and 45b are printed and dried on the copper foils 43a and 43b for negative electrodes as in FIG. 1b, cracks 'C' are generated as shown in FIG. 2a, due to the thickness of the coated copper foils 43a and 43b for negative electrodes. In case of being inserted into the PCB, the copper foils should be no more than ½ oz (18 μm) or 1 oz (36 μm) thick. However, the above printed capacitors have a thickness of 10 μm, and thus end portions of the copper foils 43a and 43b for negative electrodes become cracked. Thereby, when the copper pastes 45a and 45b connected to the copper foils 44a and 44b for positive electrodes are printed, short may occur between the positive electrodes and the negative electrodes.

In addition, the above manufacturing process is disadvantageous in terms of the non-uniform insulation distance between a first layer and a second layer shown in FIG. 1e.

After the embedded capacitors 45a and 45b are laminated along with the insulation layers 47a and 47b according to the process shown in FIGS. 1a through 1e, insulation distance (A portion) between the first layer and the capacitor is considerably different from the insulation distance (B portion) between the first layer and the second layer, as shown in FIG. 2b. For instance, upon lamination of 80 μm thick insulation layer, the insulation distance between the first layer and the copper power electrodes 46a and 46b of the capacitor corresponding to the A portion is in the range of 20-30 μm. Meanwhile, the insulation distance between the first layer and the second layer FR-4 core 42 or the second layer copper foil corresponding to the B portion falls in the range of 60-70 μm. The reason for the large difference in insulation distance is that the capacitor pastes 45a and 45b are 10-15 μm thick and the copper pastes as the power electrodes 46a and 46b are 10-15 μm thick. Such a difference in the insulation distance between the first layer and the second layer results in poor impedance of signal circuit in the first and the second layers.

Further, the above process has the drawback, such as generation of a foreign substance by printing and drying of the capacitor pastes 45a and 45b and the copper pastes 46a and 46b.

That is, when the capacitor pastes 45a and 45b are printed at a predetermined thickness of 10-15 μm and dried at 150° C. or higher for 30-90 min as in FIG. 1b, and then the copper pastes 46a and 46b are printed and dried thereupon, voids are frequently generated upon drying due to the foreign substance when being printed. Such voids cause layer short between the positive electrodes and the negative electrodes when the copper pastes 46a and 46b connected to the copper foils 44a and 44b for positive electrodes are printed and dried on top of the capacitor pastes 45a and 45b.

Alternatively, referring to FIGS. 3a through 3f, there is sequentially shown a manufacturing process of a printed circuit board having embedded discrete capacitors according to a second embodiment of conventional techniques, in which a photo-dielectric resin is coated on the PCB to form the discrete capacitor. The ceramic filled photo-dielectric resin is coated on an inner layer of the PCB to prepare the embedded discrete capacitor, which is described in U.S. Pat. No. 6,349,456 patented by Motorola, Inc., the contents thereof being incorporated herein for reference.

In FIG. 3a, a ceramic powder-containing photo-dielectric resin 14 is coated on a PCB 10 having a conductive layer 12 attached thereon, and exposed and dried.

In FIG. 3b, a copper foil 16 is superimposed on the dried photo-dielectric resin 14. In the drawing, reference numeral 18 designates a sacrificial layer plated with tin formed on the copper foil 16 in order to be used as a copper etching resist.

In FIG. 3c, a dry film is laminated onto the sacrificial layer 18, and exposed and developed, whereby the sacrificial layer 18 and the copper foil 16 are etched to define top electrodes 20.

In FIG. 3d, the photo-dielectric resin 14 positioned under the top electrodes 20 is exposed and the photo-dielectric resin 22 is etched. As such, the top copper electrodes 20 are used as a photomask of the photo-dielectric resin 14.

In FIG. 3e, the copper foil 12 positioned under the etched photo-dielectric resin 22 is etched to define bottom electrodes 24.

In FIG. 3f, the capacitor layer 32 formed on the inner layer 10 of the PCB is interposed between insulation layers 26, onto which a metal layer 30 is layered.

Thereafter, the TH and the LBVH are formed in the laminated layers, and the capacitors 32 present in the PCB are connected to a power terminal and a ground terminal of IC chip mounted on an outer layer of the PCB, to manufacture a PCB having embedded discrete capacitors.

However, the above manufacturing process according to the second embodiment of conventional techniques is disadvantageous in terms of its high manufacturing cost.

In order to prepare the embedded discrete capacitor by the ceramic filled photo-dielectric resin 14 coated on the PCB, the top electrodes 20 and the bottom electrodes 24 should be patterned. By use of large numbers of processes, completely independent discrete capacitors are fabricated. Thus, cost required for fabrication of such capacitors increases. The photo-dielectric resin 14 is printed to the whole surface of the bottom electrode 12 as the copper layer and exposed, and the irradiated dielectric is etched and removed. Hence, when small numbers of the embedded capacitors are realized, large amounts of photo-dielectric positive resin are used, thus increasing loss of materials.

Further, the above process suffers from generation of short between the bottom electrodes 24.

That is, after the layered copper foil 16 is patterned to define the top electrodes 20, the photo-dielectric resin 14 remaining under the etched copper foil 16 is irradiated and then removed by use of an etching solution. As such, in case where a width of the portion to be removed is narrow, the dielectric resin 14 positioned above the lower copper foil 12 may not be etched. This is because the photosensitive agent in the photo-dielectric resin 14 is not completely irradiated, which can be attributed to thermal curing (110° C., 60 min) of the photo-dielectric resin 14. In particular, the dielectric resin 14 adjacent to the lower copper foil 12 is difficult to etch. Consequently, the lower copper foil 12 is not etched, and shorts between the bottom electrodes 24 may occur.

Turning now to FIGS. 4a through 4c, there is sequentially illustrated a manufacturing process for a printed circuit board having embedded capacitors according to a third embodiment of conventional techniques, in which a dielectric layer with capacitance properties is used. The dielectric layer having capacitance properties is inserted into the PCB, thereby fabricating the embedded capacitor capable of being substituted for a decoupling capacitor mounted externally on the PCB, which is described in U.S. Pat. Nos. 5,079,069, 5,261,153 and 5,800,575 patented by Sanmina Corporation, USA, the contents thereof being incorporated herein for reference.

In FIG. 4a, a copper coated laminate 61 having high-dielectric constant is disposed between copper layers 62 and 63, and a dry film is laminated on the copper layers 62 and 63. Then, through processes of exposure and development, the copper layers 62 and 63 are etched to define a power electrode of the capacitor and clearance between the electrodes.

In FIG. 4b, the inner layer 61 of the PCB subjected to the above step is interposed between insulation layers 64a and 64b and laminated, after which outer copper foils 65a and 65b are superimposed on the insulation layers 64a and 64b.

In FIG. 4c, the TH and the LBVH are formed in the laminated layers, by which the capacitors present in the PCB are connected to a power terminal and a ground terminal of IC chips 68a and 68b mounted to an outer layer of the PCB to function as a power distributed decoupling capacitor. In the drawing, reference numerals 67a and 67b designate clearance between the ground electrode and the power electrode, which is widened to the extent of not bringing the TH or LBVH into contact with the electrodes.

However, in the above manufacturing process according to the third embodiment of conventional techniques, there is the problem of low capacitance, due to low dielectric constant of the embedded capacitor layer.

That is, in the case of using a thin dielectric layer with a thickness of 10-50 μm as in FIG. 4a, the material purchased from Sanmina Corporation, USA, comprises FR-4 dielectric materials having a thickness of 25 μm or 50 μm between the copper foils, used as the power electrode, and the ground electrode, in which the dielectric constant of FR-4 ranges from 4 to 5. Practically, capacitance per unit area (0.5-1 nF/in$^2$) is considerably lower than generally used decoupling discrete chip capacitor (100 nF/in$^2$). Thus limitations are imposed on fabrication of the embedded capacitor.

Further, in the above process, there is another problem, such as a thickened PCB due to insertion of the embedded capacitor.

That is, with the intention of obtaining high capacitance by means of the FR-4 dielectric, large numbers of embedded capacitor layers should be inserted, whereby the number of the layers of the PCB increases and the PCB becomes thick, thus increasing a manufacturing cost.

In addition, a further problem in the above manufacturing process is that, upon patterning the upper copper foil for use as a power electrode and the lower copper foil for use as a ground electrode, the thin dielectric film used to obtain high capacitance is subjected to the PCB fabrication process including lamination and patterning of the dry film, thereby causing shorts and cracks between the power electrode and the ground electrode, as shown in FIG. 5.

Specifically, FIG. 5 shows the problem of the PCB embedded with the capacitor formed by insertion of the dielectric having capacitance properties. As shown in FIG. 5, in the PCB having the embedded capacitor, 18-35 μm thick power electrode 92 and the ground electrode 93 formed on the 8-10 μm thick layer 91 with high-dielectric constant cause a short 'G' and cracking 'F'.

In general, capacitance depends on the area and thickness of the capacitor, and is calculated from the following Equation 1:

Equation 1

$$C = \varepsilon_r \varepsilon_o \left(\frac{A}{D}\right)$$

wherein,
$\varepsilon_r$ is a dielectric constant of the dielectric
$\varepsilon_o$ is a constant having $8.855 \times 10^{-8}$
A is a surface area of the dielectric, and
D is a thickness of the dielectric.

In order to fabricate a capacitor having high capacitance, the dielectric constant of the dielectric should be high. Additionally, as the dielectric is thinned and surface area thereof is enlarged, the capacitance of the capacitor becomes increased. The capacitance of the bimodal polymer ceramic composite is 5-7 nF/cm$^2$ while being 10 μm thick.

In U.S. Pat. No. 6,274,224 patented by 3M Co., there is disclosed the use of a thin film type dielectric layer having a thickness of 8-10 μm in a mixed composite form of BaTiO$_3$ ceramic powders with a thermosetting plastic epoxy or polyimide between copper foils used as a power electrode and a ground electrode, in which capacitance per unit area (10 nF/in$^2$) is relatively high, but shorts and cracking between the power electrode and the ground electrode may occur due to the thinness of the material.

SUMMARY OF THE INVENTION

Therefore, it is an object of the present invention to solve the problems encountered in the prior art and to provide a printed circuit board having embedded capacitors, which is advantageous in terms of high capacitance by embedding the capacitor formed from a polymer capacitor paste having high-dielectric constant through a coating process, and a method of manufacturing the printed circuit board.

It is another object of the present invention to provide a printed circuit board having embedded capacitors, which is applicable to the preparation of products having higher frequency by ensuring uniform insulation distance on inner layers of the printed circuit board by use of a polymer capacitor paste having high-dielectric constant, and a method of manufacturing the printed circuit board.

It is a further object of the present invention to provide a printed circuit board having embedded capacitors, which is advantageous in terms of stable process workability due to generation of no shorts and no cracking between a power electrode and a ground electrode, and a method of manufacturing the printed circuit board.

In order to achieve the above objects, there is provided a method of manufacturing a printed circuit board with embedded capacitors according to the present invention, comprising the steps of forming a ground layer copper foil on an inner layer of a printed circuit board, followed by roughening a surface of the ground layer copper foil; applying a high-dielectric constant of a polymer capacitor paste at a predetermined thickness on the ground layer copper foil, and curing the applied polymer capacitor paste; layering a power layer copper foil on the cured capacitor; forming a dry film pattern on the power layer copper foil, and etching the dry film pattern by use of an etching mask so that the power layer copper foil is partitioned; laminating an insulation layer-attached copper film on the power layer copper foil; forming a blind via-hole and a through-hole at predetermined portions of the insulation layer-attached copper film; and plating the blind via-hole and the through-hole for layer connection.

As such, it is preferred that the insulation layer-attached copper film is formed of a resin-coated copper (RCC) according to a built-up process.

In addition, the ground layer copper foil is characterized by roughening the surface thereof at a thickness of 1-2 μm to increase a bonding force with the capacitor paste.

The roughened surface is formed by any method selected from the group consisting of soft etching, black oxide, brown oxide, MEC (Acid Base Chemical), ceramic buff, and Z-scrubbing.

Preferably, the capacitor paste is in a mixed composite form of BaTiO$_3$ ceramic powders having high-dielectric constant of 1,000-10,000 with a thermosetting epoxy resin or polyimide. Further, it is preferred that the capacitor paste is a polymer ceramic composite having a dielectric constant of 80-90 by uniformly dispersing BaTiO$_3$ powders, comprising bimodal micropowders of 0.9 μm in diameter and 60 nm in diameter, mixed at a volume ratio of 3:1-5:1, into the epoxy resin.

The capacitor paste is coated on the roughened copper foil by a screen printing process or a roll coating process.

The capacitor paste is preferably coated at a thickness of 8-25 μm, in which a liquid phase of the capacitor paste is semi-dried to a solid phase of B-stage at 90-110° C. for 10 min in an oven.

It is preferable that the capacitor paste semi-dried to the B-stage is completely dried at 150-180° C. for 30-60 min under 35 kg/cm².

The power layer copper foil is partitioned so that when each constituent part to be mounted on a printed circuit board has different operation powers, the power layer copper foil is divided into cells corresponding to each operation power.

The blind via-hole is formed by use of a laser drill, and the through-hole is formed using a mechanical drill, in which the blind via-hole and the through-hole are connected to the power layer copper foil and the ground layer copper foil formed on the inner layer of the printed circuit board through electroless copper plating, respectively.

The above method of manufacturing the printed circuit board of the present invention further comprises the step of connecting the power layer copper foil and the ground layer copper foil to a power pad and a ground pad of an integrated circuit (IC) chip to be mounted on the printed circuit board, respectively. In addition, a capacitor layer coated with the capacitor paste functions as a decoupling capacitor for the IC chip.

Meanwhile, a printed circuit board having embedded capacitors of the present invention comprises an inner layer of a multi-layered printed circuit board having a copper-clad laminate adhered thereon by means of an adhesive; a ground layer copper foil having a roughened surface, formed at a top and a bottom of the inner layer; and a polymer capacitor paste having high-dielectric constant coated at a predetermined thickness and cured on the ground layer copper foil. The printed circuit board also includes a power layer copper foil formed on the cured capacitor, in which a dry film pattern is laminated on the power layer copper foil, and is etched by use of an etching mask to partition the power layer copper foil. In addition, the inventive printed circuit board includes an insulation layer-attached copper film formed on the power layer copper foil, a blind via-hole and a through-hole formed at predetermined portions of the insulation layer-attached copper film, and a plated layer of the blind via-hole and the through-hole for layer connection of the printed circuit board.

Therefore, a sludge which is in a mixed composite form of BaTiO₃ ceramic powders having high-dielectric constant and a thermosetting plastic epoxy resin or polyimide is printed on the ground layer copper foil formed on the inner layer of the multi-layered printed circuit board, and is semi-dried to a state of the B-stage, and the power layer copper foil is coated on the sludge layer. Thereby, the printed circuit board having embedded decoupling capacitors can be manufactured, which is advantageous in terms of high capacitance, simple preparation process and high reliability.

DETAILED DESCRIPTION OF THE INVENTION

Below, a detailed description will be given of a printed circuit board with embedded capacitor according to the present invention and a manufacturing method thereof, with reference to the accompanying drawings.

Figure 1A:
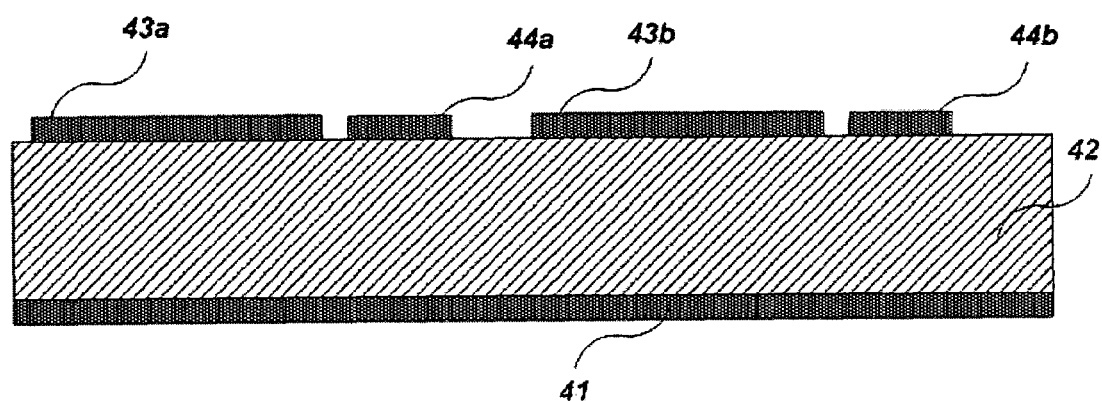
FIGS. 1a through 1e are views showing a fabrication process of a printed circuit board embedding polymer thick film type capacitors according to a first embodiment of conventional techniques.
Figure 1B:
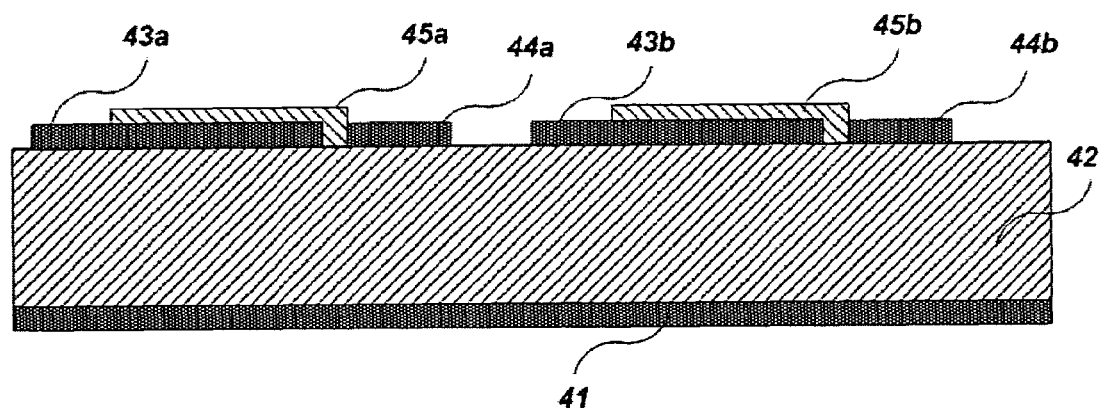
Figure 1C:
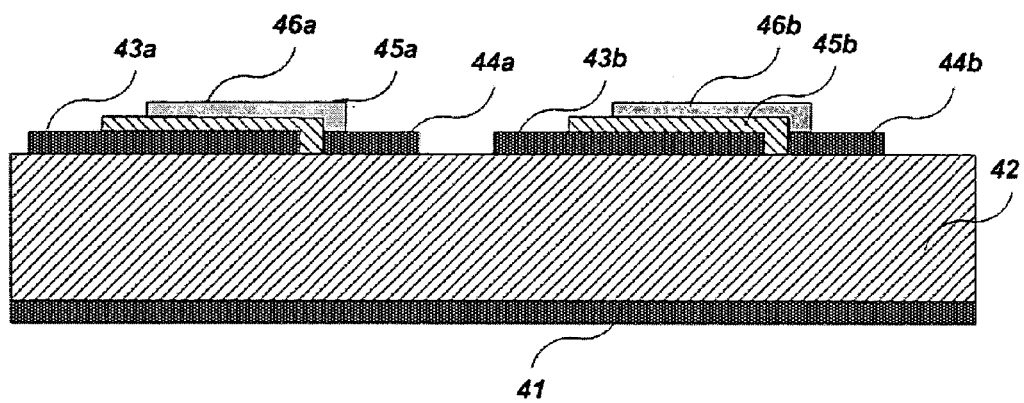
Figure 1D:
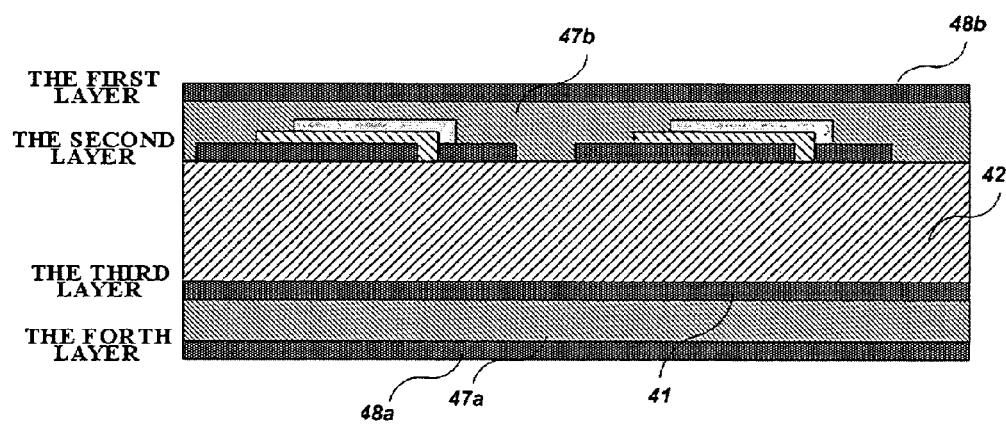
Figure 1E:
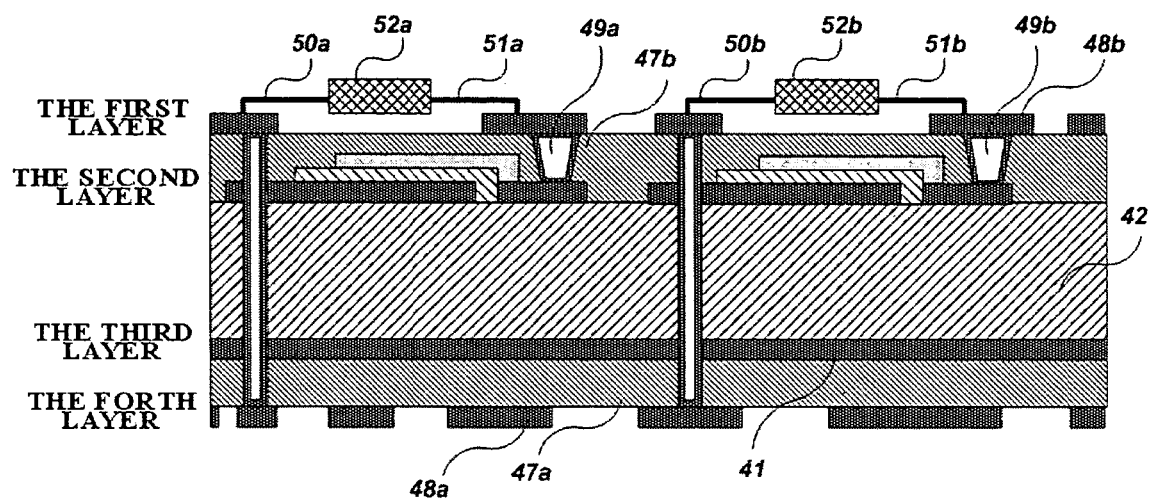
Figure 2A:
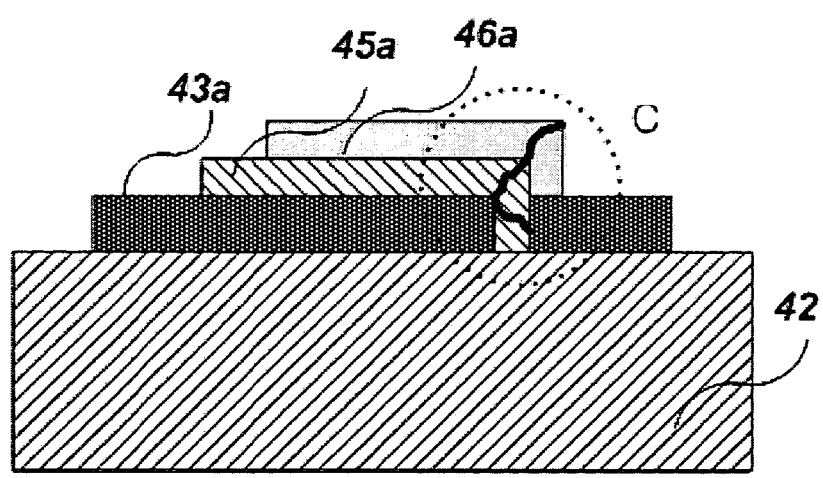
FIGS. 2a and 2b are views explaining the problems of the printed circuit board fabricated by FIGS. 1a through 1e.
Figure 2B:
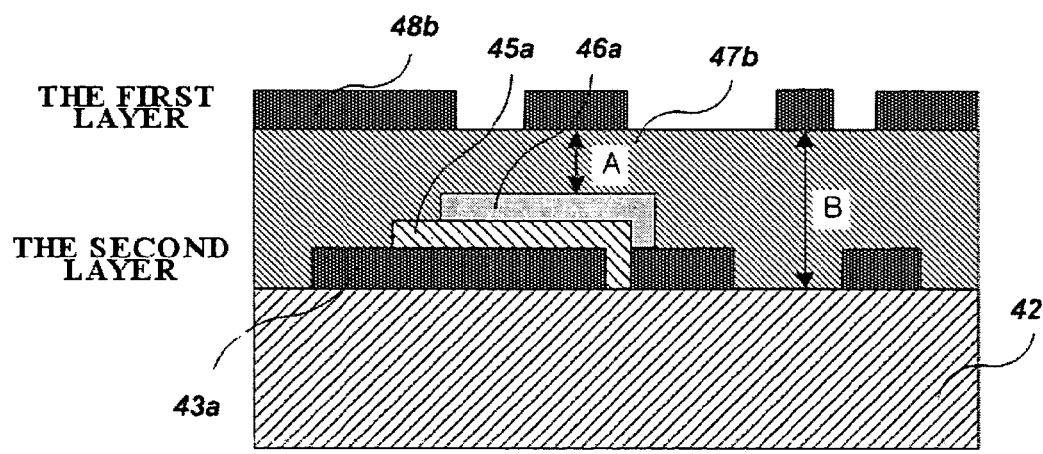
Figure 3A:
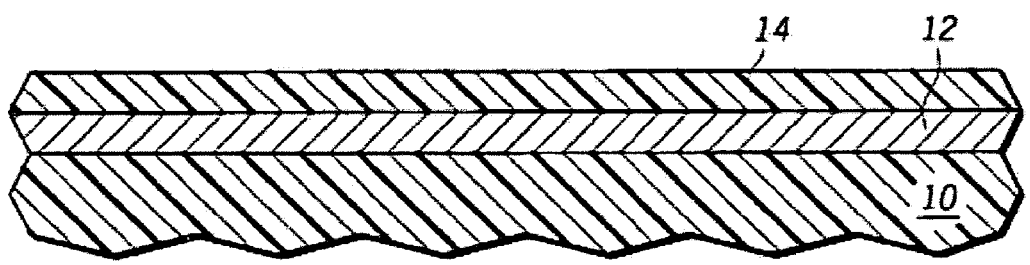
FIGS. 3a through 3f are views showing a fabrication process of a printed circuit board embedding discrete capacitors formed by a coated photo-dielectric resin according to a second embodiment of conventional techniques.
Figure 3B:
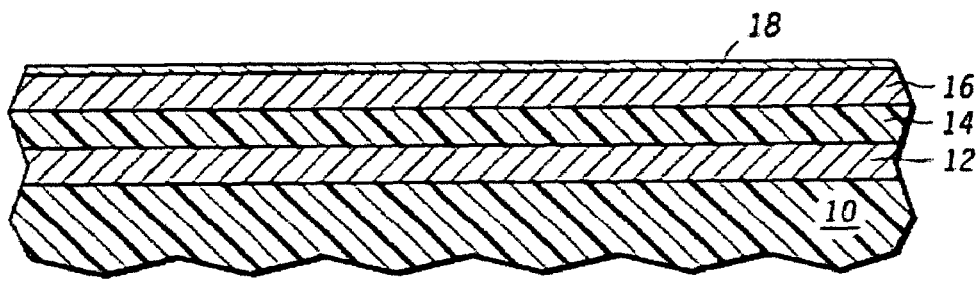
Figure 3C:
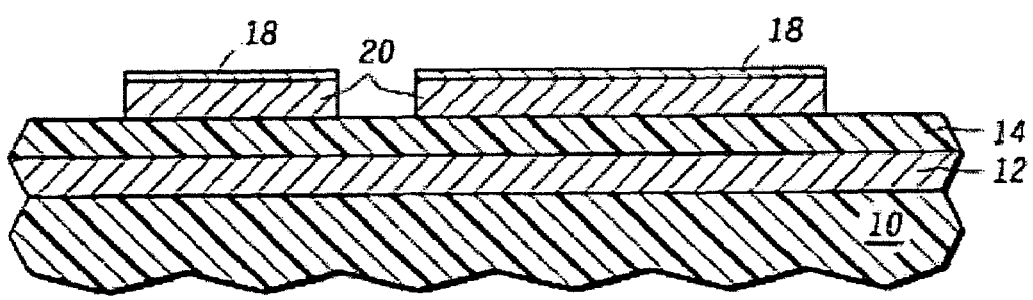
Figure 3D:
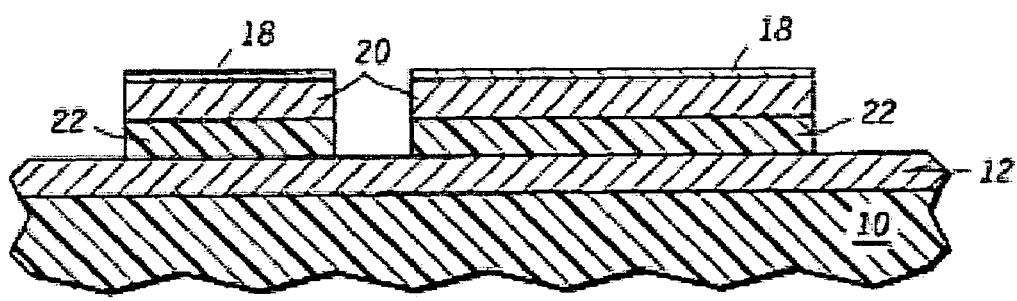
Figure 3E:
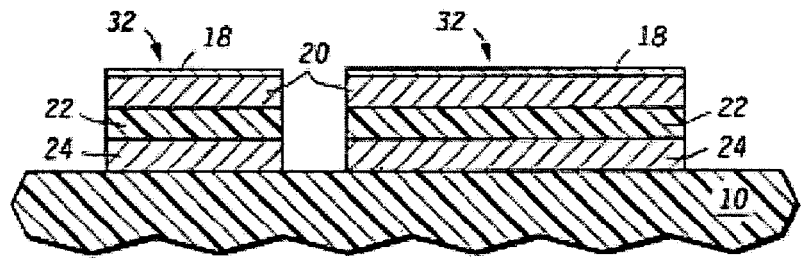
Figure 3F:
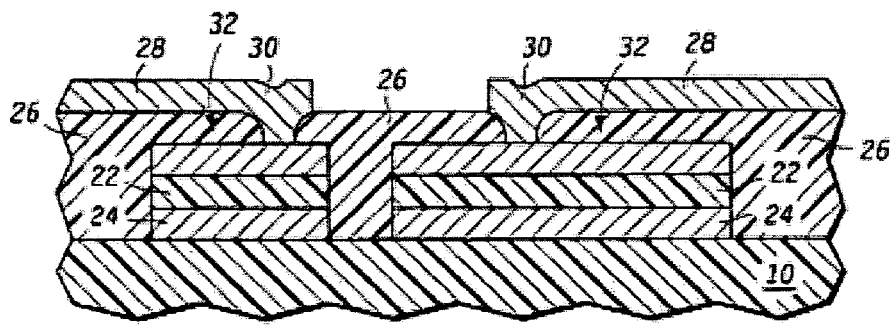
Figure 4A:
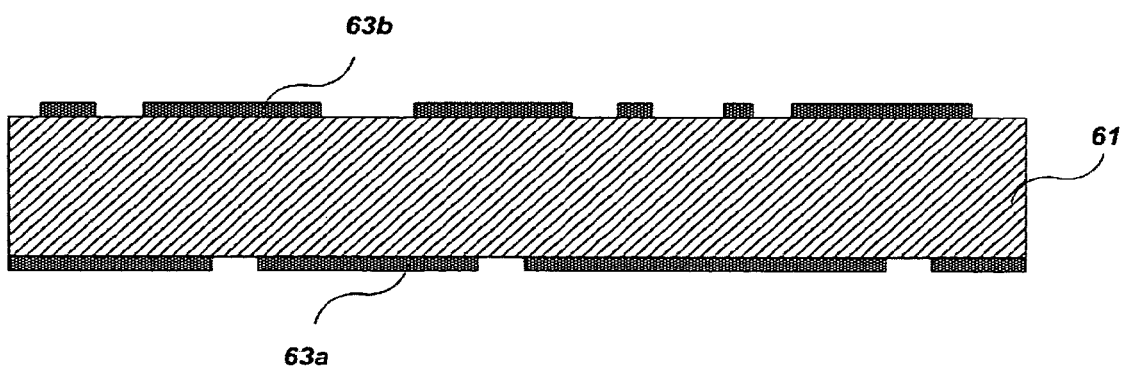
FIGS. 4a through 4c are views showing a fabrication process of a printed circuit board embedding capacitors formed by an inserted dielectric layer having capacitance properties according to a third embodiment of conventional techniques.
Figure 4B:
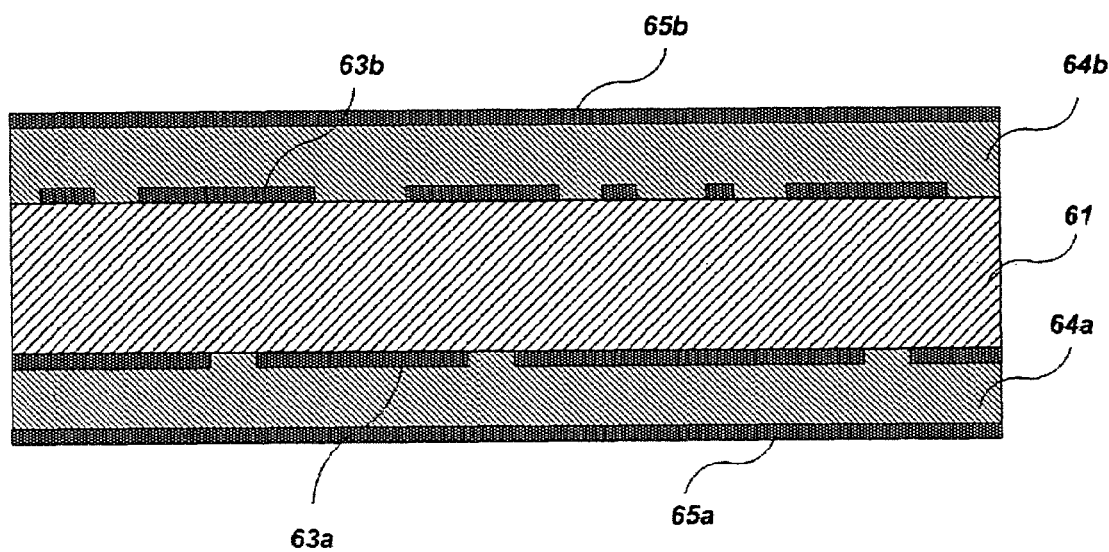
Figure 4C:
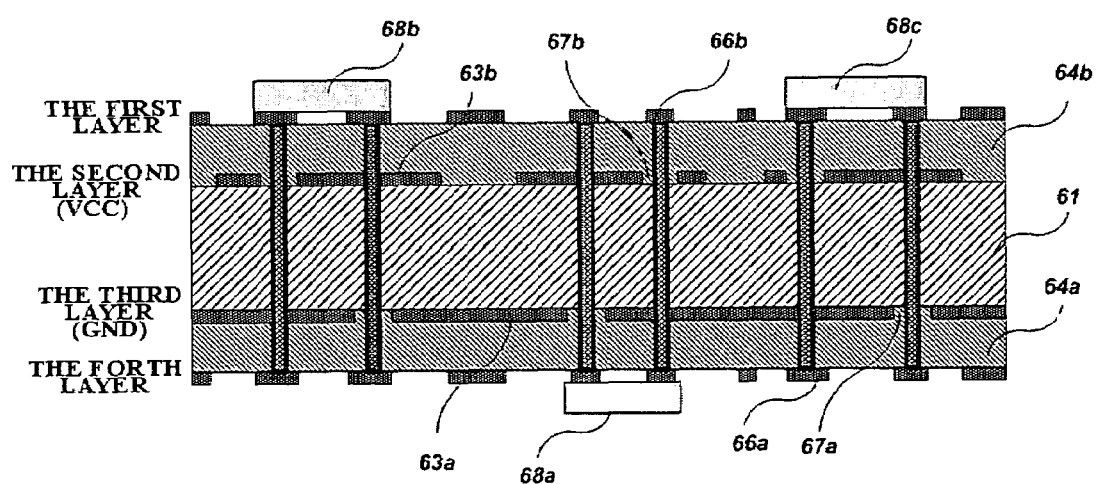
Figure 5:
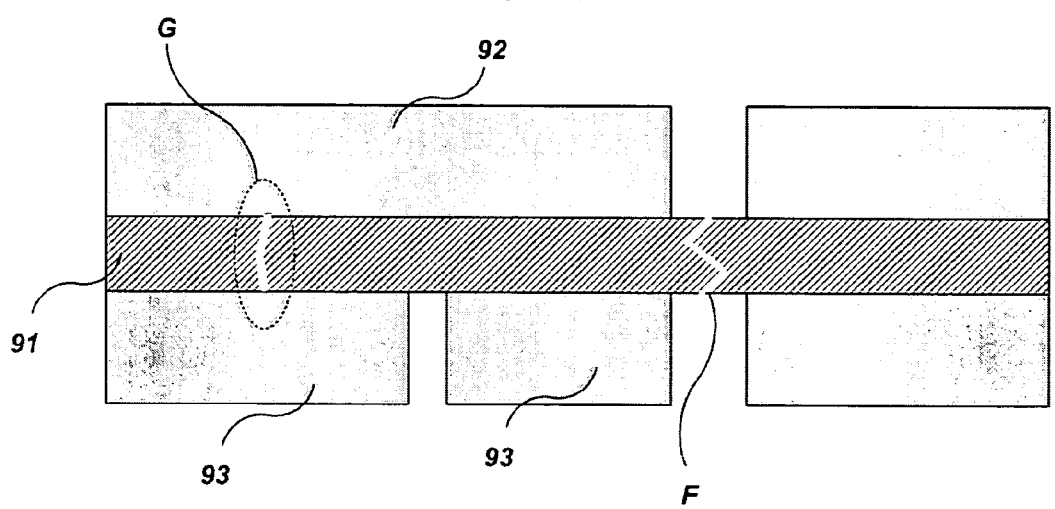
FIG. 5 is a view for explaining the problems of the printed circuit board fabricated by FIGS. 4a through 4c.
Figure 6:
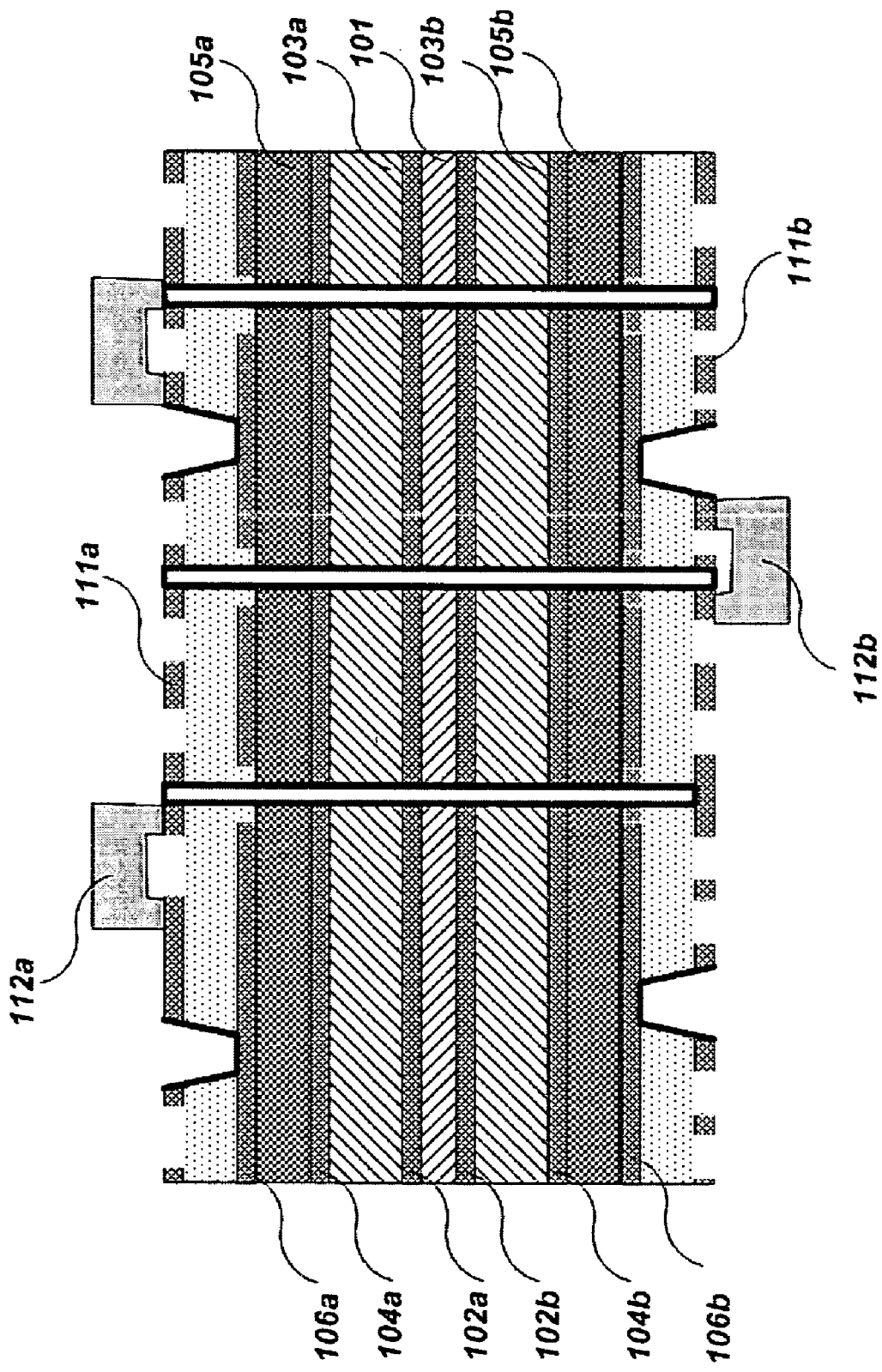
FIG. 6 is a cross-sectional view of a printed circuit board having embedded capacitors, which is high in capacitance, by coating a capacitor paste having high-dielectric constant according to the present invention.

FIG. 6 is a cross-sectional view of a printed circuit board having embedded capacitors, which is high in capacitance, by coating a capacitor paste having high-dielectric constant on the printed circuit board.

Referring to FIG. 6, high-dielectric constant of polymer capacitor pastes 105a and 105b are coated on both sides of an inner layer of a printed circuit board (PCB), and are semi-dried to a state of B-stage, thereby fabricating the PCB with embedded capacitors having high capacitance.

In this regard, BaTiO₃ ceramic powders having high-dielectric constant are mixed with a thermosetting plastic epoxy or polyimide to make a sludge in the composite form, any one side of which is printed on the ground layer copper foil or the power layer copper foil in the multi-layered PCB.

The printed sludge is semi-dried to a state of B-stage, the other side of which is attached to the power layer or the ground layer. Thereby, the PCB of the present invention contains embedded decoupling capacitors.

As such, the capacitor pastes 105a and 105b are in the mixed composite from of BaTiO₃ ceramic powders having high-dielectric constant (DK: 1,000-10,000) with a thermosetting epoxy resin or polyimide, and it is possible to realize high capacitance. As for the capacitor pastes 105a and 105b, BaTiO₃ powders comprise not a unimodal powder size but a bimodal powder size. Powders having 0.9 μm in diameter are mixed with powders having 60 nm in diameter at a ratio of 3:1-5:1, and the mixed powders are uniformly disposed into the epoxy resin, to afford a polymer ceramic composite having a dielectric constant of 80-90.

Referring to FIGS. 7a through 7h, a method of fabricating the PCB with embedded capacitors is described.

FIGS. 7a through 7h are views sequentially illustrating a manufacturing process of the PCB with embedded capacitors according to the present invention.

As a first step, copper foils 102a and 102b are bonded at both surfaces of a prepreg 101, to form a first core layer 103a and a second core layer 103b. Copper foils 104a and 104b are laminated on each core layer, and surfaces thereof are roughened in order to increase a bonding force between the copper foils 104a and 104b and capacitor pastes 105a and 105b to be coated at a next step. The prepreg 101, the copper foils 102a and 102b, the first core layer 103a, the second core layer 103b and the copper foils 104a and 104b, which are in a laminated state, correspond to the inner layer of the PCB of the present invention.

Figure 7A:
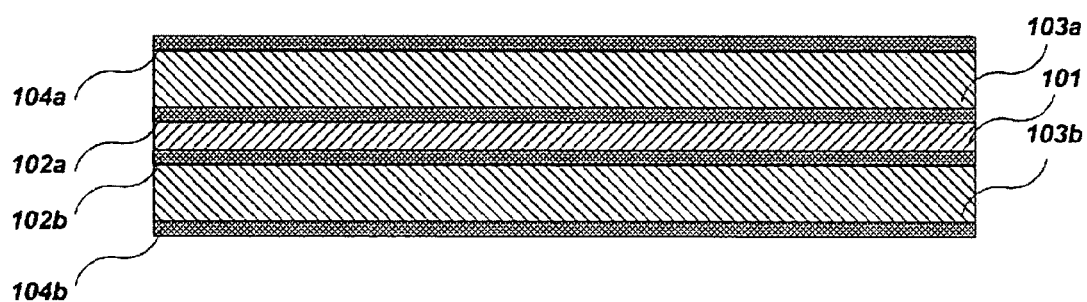
FIGS. 7a through 7h are views showing a fabrication process of a printed circuit board embedding the capacitors according to the present invention.

The roughened surfaces of the copper foils 104a and 104b are formed by chemical and physical methods. Examples of the chemical methods include soft etching, black oxide or brown oxide, MEC (Acid Base Chemical), etc. Meanwhile, the physical methods are exemplified by ceramic buff or Z-scrubbing treatment. Using the aforementioned methods, the surfaces of the copper foils 104a and 104b are roughened at a thickness of 1-2 μm (FIG. 7a). The first core layer 103a and the second core layer 103b are formed of FR-4. In addition, the copper foils 104a and 104b may be used as a ground layer copper foil or a power layer copper foil. In the present invention, the above copper foils are regarded as the ground layer copper foil.

Figure 7B:
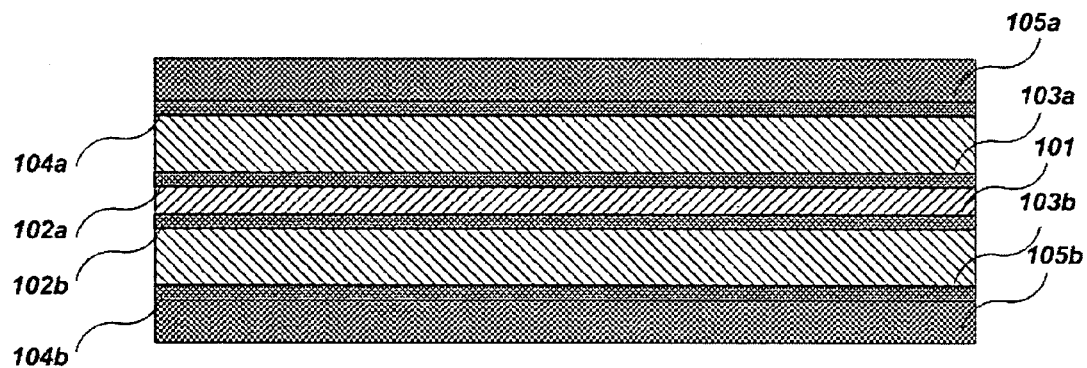

As a second step, the capacitor pastes 105a and 105b are applied onto the roughened copper foils 104a and 104b at a predetermined thickness by means of a screen printing process or a roll coating process (FIG. 7b). The applied thickness falls in the range of 8-25 μm, in consideration of the overall thickness, after power layer copper foils 106a and 106b are further layered. The coated pastes are semi-dried at 90-110° C. for 10 min in a general oven, whereby the liquid phase of the pastes 105a and 105b are converted to a solid phase of B-stage.

Figure 7C:
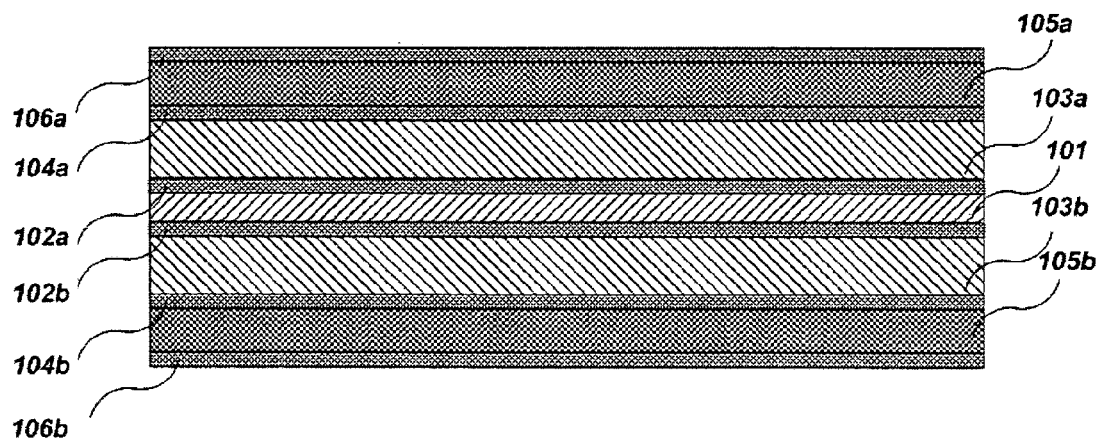

As a third step, the power layer copper foils 106a and 106b are superimposed on the semi-dried B-stage capacitor pastes 105a and 105b, to form embedded capacitor layers (FIG. 7c).

The semi-dried B-stage capacitor pastes are completely dried at a proper temperature, for example, 150-180° C., for 30-60 min under a predetermined pressure of 35 kg/cm², whereby the capacitor paste is strongly bonded with the upper copper foil positioned thereon by high close contact force.

Figure 7D:
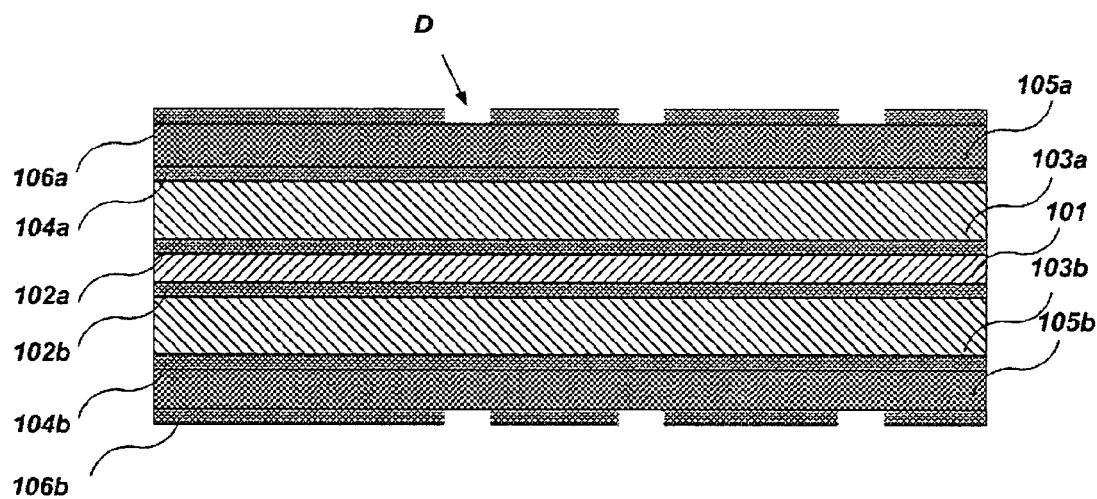

As a fourth step, a dry film is laminated onto each of the power layer copper foils 106a and 106b of the embedded capacitor layers, exposed, and then developed. Then, each dry film is etched by use of an etching resistor, whereby the power layer copper foils 106a and 106b are partitioned by each clearance D (FIG. 7d). The reason why the power layer copper foils 106a and 106b are partitioned is that the power layer copper foils 106a and 106b are divided into cells corresponding to each operation voltage, attributed to different operation voltages of each constituent component. A more detailed description of such cells will be given with reference to FIG. 8, later herein.

Figure 7E:
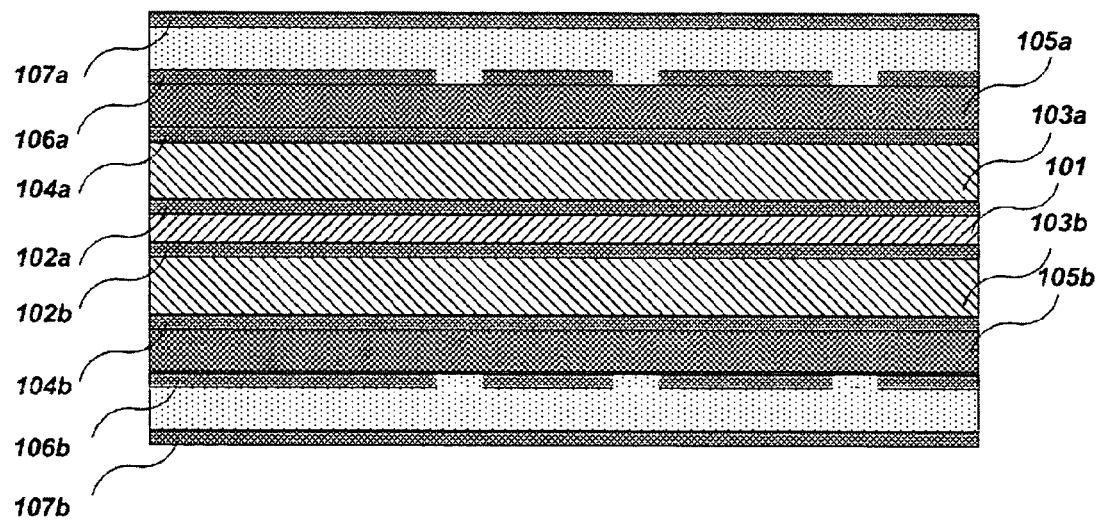
Figure 7F:
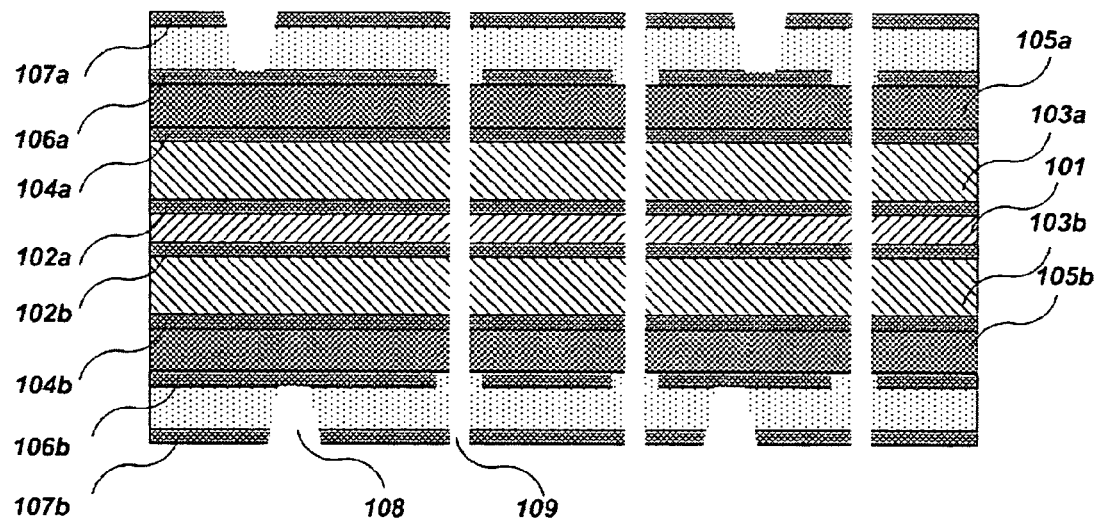

As a fifth step, resin-coated copper foils 107a and 107b formed of a laser drillable resin are laminated onto the power layer copper foils 106a and 106b by a built-up process (FIG. 7e).

Figure 7G:
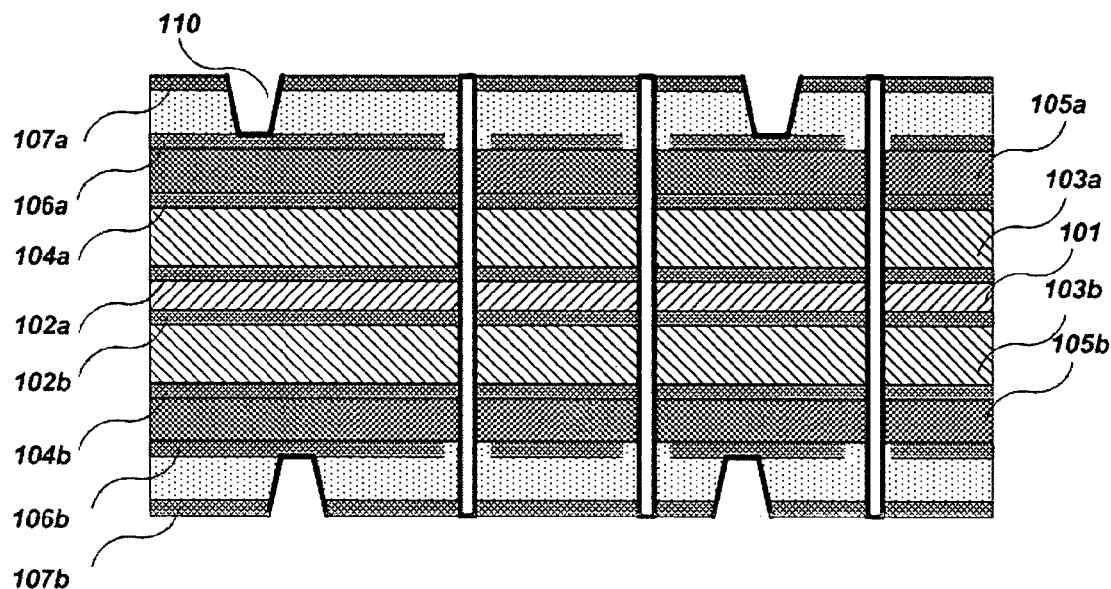

As a sixth step, blind via-holes (BVH) 108 are formed in the resin-coated copper foils 107a and 107b using a laser drill (FIG. 7f), while through-holes (TH) 109 are formed in the resin-coated copper foils 107a and 107b by use of a mechanical drill. The BVH 108 and the TH 109 are subjected to electroless Cu plating, to form each plated layer 110 in the holes for layer connection. In particular, each hole is connected to the power layer copper foils 106a and 106b and the ground layer copper foils 104a and 104b of the embedded capacitor layers (FIG. 7g). In other words, each BVH 108 is connected to the power layer copper foils 106a and 106b, while each TH 109 is connected to the ground layer copper foils 104a and 104b.

Figure 7H:
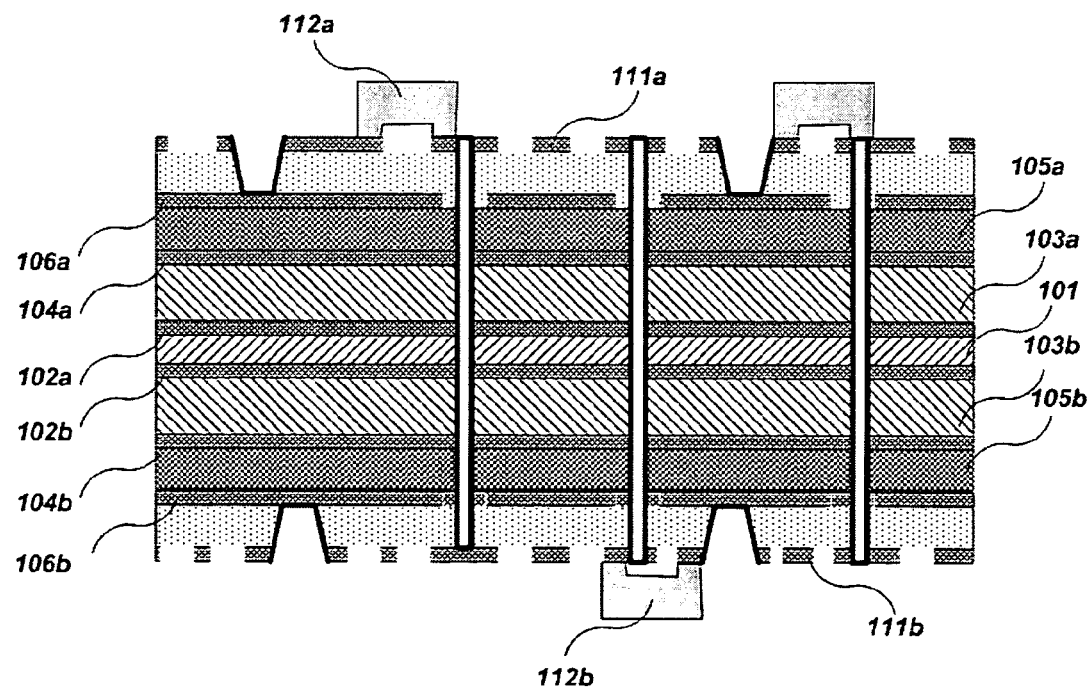

As a seventh step, the resin-coated copper foils 107a and 107b are exposed and developed, to form a power layer, a ground layer and circuit patterns 111a and 111b. Thereafter, a power pad and a ground pad of IC chips 112a and 112b are connected to the power layer copper foils 106a and 106b and the ground layer copper foils 104a and 104b of the capacitor layers, respectively (FIG. 7h). As such, the embedded capacitor layers 105a and 105b, formed on the inner layer of the PCB, function as a decoupling capacitor for the IC chips 112a and 112b.

Figure 8:
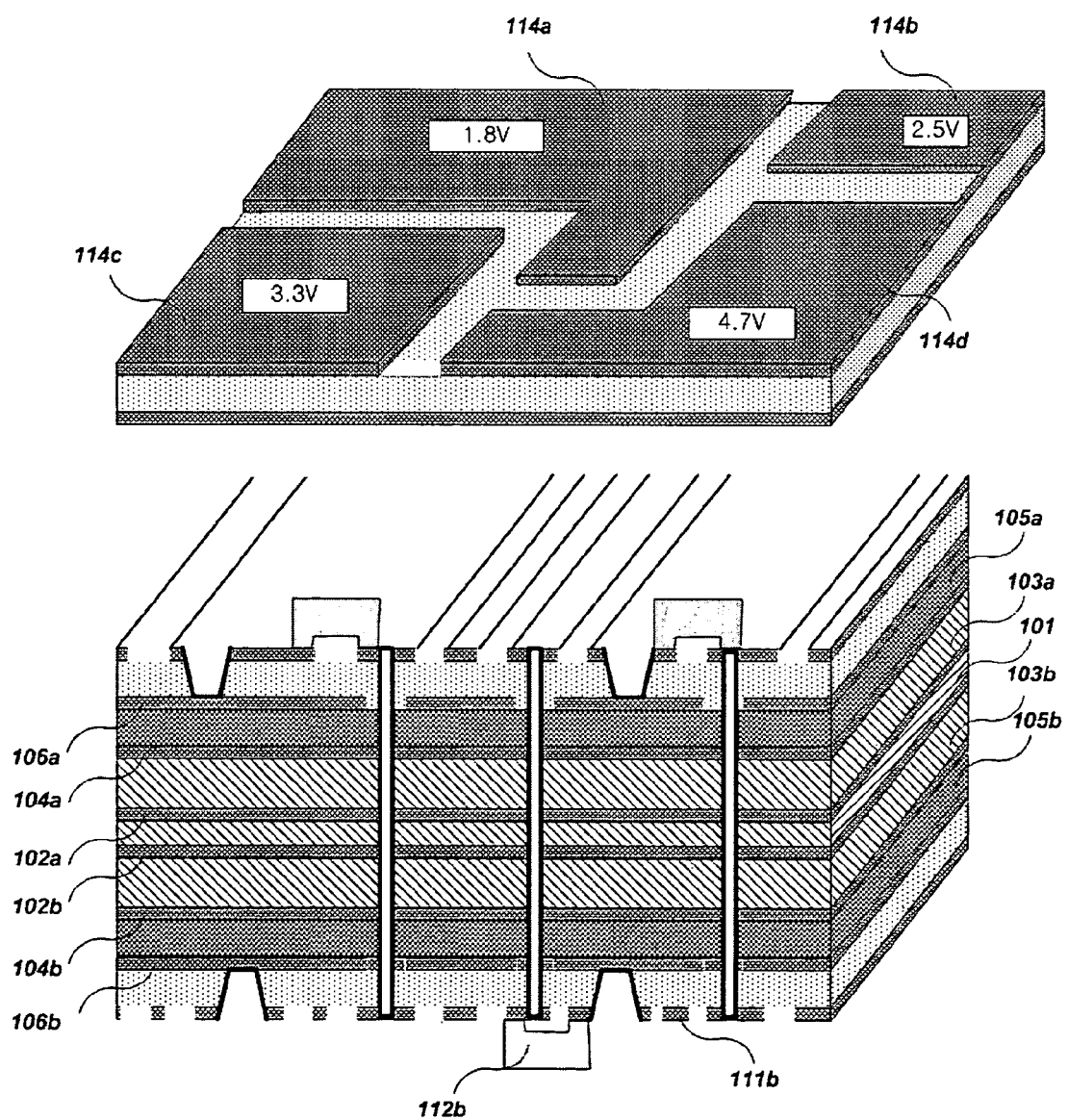
FIG. 8 is a view showing a formation process of power electrodes corresponding to each operation voltage of the printed circuit board having embedded capacitors according to the present invention.

FIG. 8 illustrates a formation process of power electrodes corresponding to each operation voltage of the PCB having embedded capacitors according to the present invention.

As shown in FIG. 8, the resin-coated copper (RCC) foils 107a and 107b as an outermost layer are partitioned to a 1.8V region 114a, a 2.5V region 114b, a 3.3V region 114c and a 4.7V region 114d according to each operation voltage. As such, the ground layer copper foils 104a and 104b may be used in common, and may be partitioned along the partitioned power layer.

In brief, $BaTiO_3$ ceramic powders having high-dielectric constant is mixed with the thermosetting plastic epoxy resin or polyimide, to make the sludge in a composite form. Such a sludge is printed on the ground layer copper foil or the power layer copper foil in the multi-layered PCB at any one side thereof, and semi-dried to a state of B-stage, after which the other side thereof is attached to the power layer or the ground layer, thus fabricating the PCB with embedded decoupling capacitors.

As described above, according to the present invention, the capacitor formed by coating the polymer capacitor paste having high-dielectric constant on the inner layer of the PCB is embedded in the PCB, thereby exhibiting high capacitance.

In addition, according to the present invention, uniform insulation distance can be ensured on the inner layer of the PCB by use of the polymer capacitor paste having high-dielectric constant, and the PCB can be applied to fabrication of products requiring higher frequency.

Further, according to the present invention, shorts and cracking between the power electrodes and the ground electrodes are not generated, thus easily and stably performing a manufacturing process of the PCB.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A printed circuit board with embedded capacitors, comprising:
    an inner layer of a multi-layered printed circuit board having a copper clad laminate adhered thereon by means of an adhesive;
    a ground layer copper foil having a roughened surface, formed at a top and a bottom of the inner layer;
    a polymer capacitor paste having high-dielectric constant coated at a predetermined thickness and cured on the ground layer copper foil, wherein the polymer capacitor paste is a polymer ceramic composite including bimodal powders;

a power layer copper foil formed on the cured capacitor paste and including a dry film pattern that is laminated on the power layer copper foil and is etched by use of an etching mask to partition the power layer copper foil, wherein the power layer copper foil are divided into cells corresponding to each operation voltage;

an insulation layer-attached copper film formed on the power layer copper foil;

a blind via-hole and a through-hole formed at predetermined portions of the insulation layer-attached copper film; and plated layers of the blind via-hole and the through-hole for layer connection of the printed circuit board, wherein the capacitor paste is the polymer ceramic composite having a dielectric constant of 80-90 by uniformly dispersing $BaTiO_3$ powders comprising bimodal micropowders of 0.9 μm in diameter and 60 nm in diameter mixed at a volume ratio of 3:1-5:1 into an epoxy resin.

2. The printed circuit board as defined in claim 1, wherein the insulation layer-attached copper film is a resin-coated copper foil.

3. The printed circuit board as defined in claim 1, wherein the surface of the ground layer copper foil is roughened at a thickness of 1-2 μm to increase a bonding force between the ground layer copper foil and the capacitor paste.

4. The printed circuit board as defined in claim 1, wherein the capacitor paste is in a mixed composite form of $BaTiO_3$ ceramic powders having high-dielectric constant of 1,000-10,000 and a thermosetting epoxy resin or polyimide.

5. The printed circuit board as defined in claim 1, wherein the capacitor paste is coated at a thickness of 8-25 μm.

* * * * *